United States Patent
Gao

(10) Patent No.: US 11,395,438 B1
(45) Date of Patent: Jul. 19, 2022

(54) LOCALIZED FLUID ACCELERATION IN IMMERSED ENVIRONMENT

(71) Applicant: Baidu USA LLC, Sunnyvale, CA (US)

(72) Inventor: Tianyi Gao, Sunnyvale, CA (US)

(73) Assignee: BAIDU USA LLC, Sunnyvale, CA (US)

(*) Notice: Subject to any disclaimer, the term of this patent is extended or adjusted under 35 U.S.C. 154(b) by 0 days.

(21) Appl. No.: 17/153,532

(22) Filed: Jan. 20, 2021

Related U.S. Application Data

(60) Provisional application No. 63/135,349, filed on Jan. 8, 2021.

(51) Int. Cl.
H05K 7/20 (2006.01)

(52) U.S. Cl.
CPC ....... *H05K 7/20272* (2013.01); *H05K 7/2039* (2013.01); *H05K 7/20236* (2013.01); *H05K 7/20781* (2013.01)

(58) Field of Classification Search
CPC .............. H05K 7/20236; H05K 7/203; H05K 7/20272; H05K 7/2039; H05K 7/20781; H05K 7/20772; H05K 7/20809; H05K 7/2079; H05K 7/20263; H05K 7/20327; H05K 7/20763; H05K 7/20218; H05K 7/20818

See application file for complete search history.

(56) References Cited

U.S. PATENT DOCUMENTS

| 5,293,754 A * | 3/1994 | Mizuno ................. H01L 23/473 165/286 |
| 2003/0062149 A1* | 4/2003 | Goodson ............... H01L 23/473 257/E23.098 |
| 2005/0205241 A1* | 9/2005 | Goodson ................. F28D 15/00 257/E23.098 |
| 2010/0103618 A1* | 4/2010 | Campbell .......... H05K 7/20772 361/699 |
| 2011/0315355 A1* | 12/2011 | Campbell .......... H05K 7/20809 165/104.33 |
| 2012/0180979 A1* | 7/2012 | Harrington ........... F28D 1/0246 165/96 |
| 2014/0071627 A1* | 3/2014 | Campbell ............... F28F 3/048 165/104.21 |

(Continued)

*Primary Examiner* — Adam B Dravininkas
(74) *Attorney, Agent, or Firm* — Womble Bond Dickinson (US) LLP

(57) ABSTRACT

A cooling system comprises an information technology (IT) container including a plurality of IT chambers, a fluid supply channel disposed at a bottom of the IT container to receive the fluid from a cooling unit and to supply the fluid to the IT chambers, a fluid return channel disposed on a top of the IT chambers to return the fluid received from the IT chambers to the cooling unit, a fluid acceleration channel disposed separately from the fluid return channel to return at least some of the fluid to the cooling unit in an accelerated manner, and one or more pumps disposed between at least some of the IT chambers immerged in the fluid environment and the fluid acceleration channel to increase a flowrate of the fluid from the corresponding IT chambers to the cooling unit via the fluid acceleration channel. For example, each IT chamber to store fluid and to populate IT equipment submerged in the fluid for immersion cooling. In an embodiment, the IT chamber includes acceleration sections.

20 Claims, 10 Drawing Sheets

(56) References Cited

U.S. PATENT DOCUMENTS

| | | | |
|---|---|---|---|
| 2014/0085823 A1* | 3/2014 | Campbell | H05K 7/20236 361/689 |
| 2015/0351281 A1* | 12/2015 | Campbell | H05K 7/20781 29/890.035 |
| 2020/0015383 A1* | 1/2020 | Gao | H05K 7/20763 |
| 2020/0288601 A1* | 9/2020 | Gao | H05K 7/20781 |

* cited by examiner

LOCALIZED FLUID ACCELERATION IN IMMERSED ENVIRONMENT

RELATED APPLICATIONS

This application claims the benefit of U.S. provisional patent application No. 63/135,349, filed Jan. 8, 2021, which is incorporated by reference in its entirety.

FIELD OF THE INVENTION

Embodiments of the present invention relate generally to data centers. More particularly, embodiments of the invention relate to immersion cooling for data centers.

BACKGROUND

Heat removal is a prominent factor in a computer system and data center design. The number of high performance electronics components such as high performance processors packaged inside servers have steadily increased, thereby increasing the amount of heat generated and dissipated during the ordinary operations of the servers. The reliability of servers used within a data center decreases if the environment in which they operate is permitted to increase in temperature over time. Maintaining a proper thermal environment is critical for normal operations of these servers in data centers, as well as the server performance and lifetime. It requires more effective and efficient heat removal solutions especially in the cases of cooling these high performance servers.

Immersion cooling technology has brought many attentions recently. Many efforts are focusing on the fluid selection, information technology (IT) side design, material compatibilities, test and verification, and so on. Most of the solutions utilize existing cooling infrastructure (cooling water/chilled water) or system. In some of the solutions, a coolant distribution unit (CDU) is used to form an external cooling loop and an internal immersion cooling fluid loop. The external cooling loop can be adapted to any type of existing data center cooling infrastructures. These solutions may not fully utilize the advantages of immersion cooling.

BRIEF DESCRIPTION OF THE DRAWINGS

Embodiments of the invention are illustrated by way of example and not limitation in the figures of the accompanying drawings in which like references indicate similar elements.

DETAILED DESCRIPTION

Figure 1:
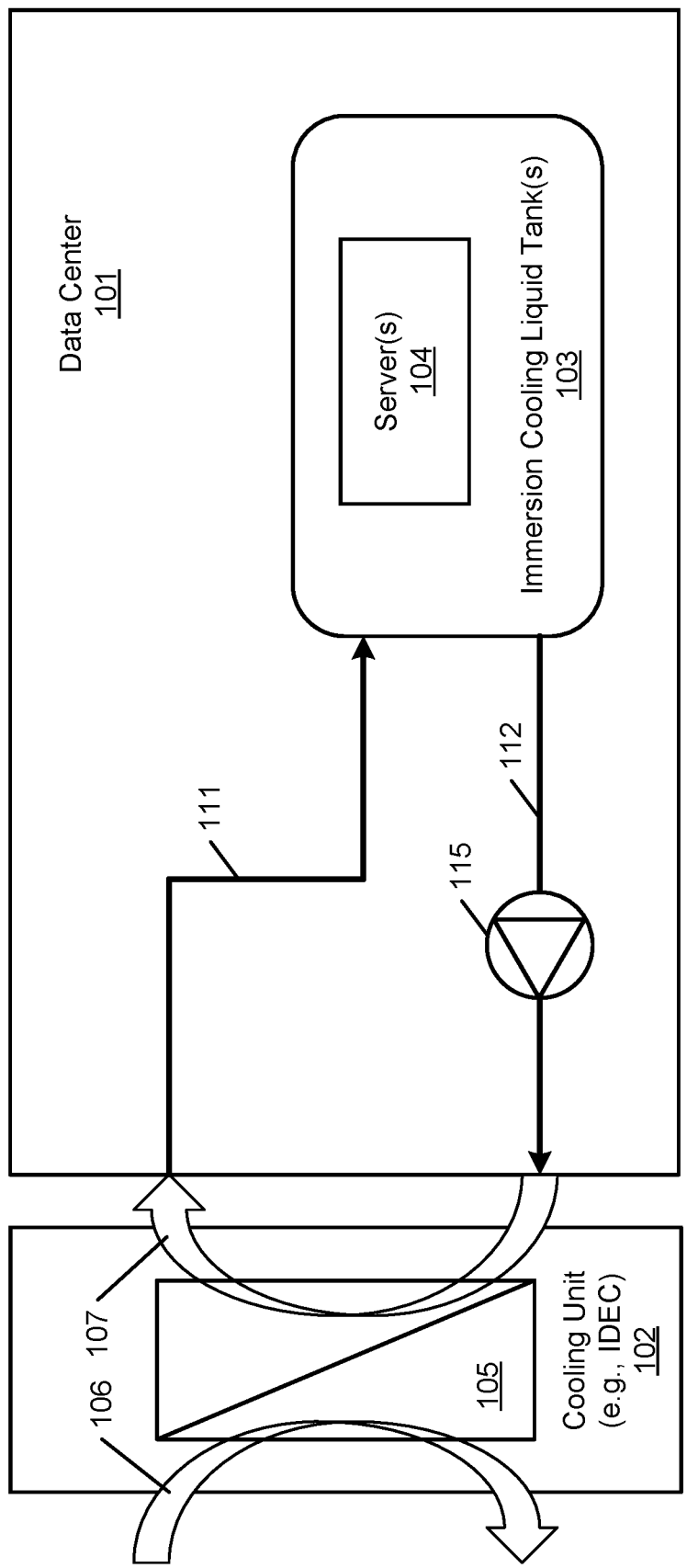
FIG. 1 is a block diagram illustrating an example of a data center system with immersion cooling according to one embodiment.

Various embodiments and aspects of the inventions will be described with reference to details discussed below, and the accompanying drawings will illustrate the various embodiments. The following description and drawings are illustrative of the invention and are not to be construed as limiting the invention. Numerous specific details are described to provide a thorough understanding of various embodiments of the present invention. However, in certain instances, well-known or conventional details are not described in order to provide a concise discussion of embodiments of the present inventions.

Reference in the specification to "one embodiment" or "an embodiment" means that a particular feature, structure, or characteristic described in conjunction with the embodiment can be included in at least one embodiment of the invention. The appearances of the phrase "in one embodiment" in various places in the specification do not necessarily all refer to the same embodiment.

The IT Hardware industry is a critical market for many reasons: it plays a crucial role in business competitiveness, service quality and availability, and also plays a significant role in the infrastructure TCO. IT Hardware is closely linked with the profit of an organization. It is one of the core competencies of the internet giant, cloud computing service providers, as well as high performance computing and AI computing related business service users and providers who build, operate, compute, store and manage other IT hardware platforms and infrastructures. The majority of the hyperscale owners are customizing full-stacks of these hardware systems. For instance, in the rapidly growing cloud computing business, the performance and cost (both capital cost and operation cost) of computing and storage hardware systems, clusters and infrastructure, all require the service providers to create customized systems that fit their individual needs the best. These markets require continuous innovation. An efficient system design and operation benefits the service providers in multiple aspects in a long term. The key to this is to develop continuously with more resilience, efficiency, and cost effective solutions and architecture. By increasing the power density of the high end processors, the power difference among the high power components and low power components increases, thereby requiring the thermal management industry to continuously provide both feasible and efficient solutions.

The first problem the current solution aims to solve is the high power density electronics' thermal management. With the increasing power of the IT equipment and power density in the system, thermal management becomes more and more challenging. The traditional air cooling systems become a bottle neck for the development and deployment of higher power computing and higher performance computing based electronics, including chips.

The second focus on the current work is to increase the operating efficiency and system capability of immersion cooling. While immersion cooling may be a proper solution for the high power density thermal management, however, the efficiency and capability of a system with an immersion cooling system still falls short of fulfilling the requirement. The current disclosure purposes to change the internal fluid management and fluid dynamics to improve the cooling system's performance and capability. Since the fluid is more efficiently managed, the system capability will increase, especially in the cases of high power density and low power density, which are co-packages on the same system.

For immersion cooling solutions, the single phase solution still requires an implementation of cooling hardware such as heat sink, to extend and maximize the heat transfer area for the high power density components. This is due to the nature of fluid circulation in a purely immersed environment, where the circulation may not sufficient for such high power density components' cooling requirement. The solution proposed in the current invention enables localized fluid acceleration and cooling enhancement for these components.

Since immersion cooling is designed for high power systems, it is common for some of the immersion tanks or containers to reach a very high power density. In such high power systems (either tank or container), the power distribution is greatly uniformly distributed, which mean that the IT power dissipation as well as thermal requirement are completely different. Advanced designs are required for such scenarios.

Solution versatility and resilience are also key requirements for modern IT hardware. The current work aims to improve the solution versatility and resilience which may be compatible for different cases as well as IT generation upgrades.

The previous design for immersion cooling does not provide efficient fluid management nor localized fluid management. The previous solution predominantly characterizes a high performance heat sink to solve back for the high power density challenge in an immersion cooling environment. This solution is limited by the power envelop of load and space, for implementing large heat sinks and so on.

The current design introduces a localized precision cooling enhancement for the IT, which proves to be especially useful for high power density equipment. The design enables the following features: Localized fluid management and acceleration for high heat load regions, advanced control design for separate regions, multi-layer fluid management and fluid dynamics in immersed environments, hardware design for the IT and IT container, flexible reconfigurable for different IT equipment and use cases for both could data center and edge computation systems.

In an embodiment, a cooling system comprises an information technology (IT) container including a plurality of IT chambers, a fluid supply channel disposed at a bottom of the IT container to receive the fluid from a cooling unit and to supply the fluid to the IT chambers, a fluid return channel disposed on a top of the IT chambers to return the fluid received from the IT chambers to the cooling unit, a fluid acceleration channel disposed separately from the fluid return channel to return at least some of the fluid to the cooling unit in an accelerated manner, and one or more pumps disposed between at least some of the IT chambers and the fluid acceleration channel to increase a flowrate of the fluid from the corresponding IT chambers to the cooling unit via the fluid acceleration channel. For example, each IT chamber to store fluid and to receive IT equipment submerged in the fluid for immersion cooling.

In an embodiment, each of the one or more pumps are configured to pump the fluid from the fluid supply channel through the corresponding IT chamber to the fluid acceleration channel.

In an embodiment, at least one IT equipment includes a regular section containing an IT component that generates heat and an acceleration section containing a local heat exchange element attached to the IT component, both the regular section and the acceleration section integrated as one complete system.

In an embodiment, a pump associated with the IT equipment is disposed in the acceleration section to increase the flowrate of the fluid in the acceleration section.

In an embodiment, the local heat exchange element includes a heat sink elevated to the acceleration section. For example, a cooling system comprises cooling hardware such as a heat sink to extend and maximize the heat transfer area for the high power density components.

In an embodiment, the fluid acceleration channel is disposed on top of the fluid return channel. In an embodiment, both acceleration channel and fluid return channel are connected to one return channel.

In an embodiment, the flowrate of the fluid in an IT chamber is controlled by a corresponding pump based on a local temperature of the fluid within the corresponding IT chamber.

In an embodiment, each pump is attached to the fluid acceleration channel and coupled to and removable from the fluid return channel of the IT container.

In an embodiment, the fluid acceleration channel and the pumps are attached to the lid, such that when the lid is lifted, the fluid acceleration channel and the pumps are lifted and removed from the IT chambers. In an embodiment, when the pumps are lifted/removed from the IT chambers, the main fluid recirculation may still function. However, since the acceleration pumps are lifted/removed from the fluid, there are no acceleration functions.

FIG. 1 is a block diagram illustrating a data center system according to one embodiment. Referring to FIG. 1, data center immersion cooling system 100 is referred to as a data center system with immersion cooling. In one embodiment, data center immersion cooling system 100 includes data center or data center unit 101 coupled to external cooling unit 102. External cooling unit 102 may be an indirect evaporative cooling (IDEC) unit. Cooling unit 102 includes a heat exchanger 105, which may be a liquid-to-liquid heat exchanger or an air-to-liquid heat exchanger. Typically, heat exchanger 105 includes a primary loop 106 and a secondary loop 107. Primary loop 106 is utilized to circulate external cooling source such as external air or external liquid. Secondary loop 107 is utilized to circulate internal cooling liquid to exchange heat with the external cooling material of primary loop 106.

In one embodiment, data center 101 includes an immersion tank 103 filled with the internal cooling liquid, i.e., immersion cooling liquid. Although there is one immersion tank shown herein, more immersion tanks can also be included within data center 101. Immersion tank 103 contains one or more server systems 104 and each server blade includes one or more IT components (e.g., processors, memory, storage devices). Server systems 104 are submerged in the internal cooling liquid. The internal cooling liquid is thermally conductive dielectric liquid designed to extract the heat from the server systems. Such cooling technique is referred to as immersion cooling.

Server immersion cooling is a computer cooling practice by which computer components or servers are submerged in a thermally conductive dielectric liquid. For example, common dielectrics which are suitable for immersion cooling are typically oil-based. Server immersion cooling has the potential of becoming a popular server cooling solution for green data centers, as it allows them to drastically reduce their energy load, regardless of their PUE. Servers and other IT hardware cooled by immersion cooling do not require fans, thus these are removed.

Referring back to FIG. 1, according to one embodiment, data center 101 includes a liquid supply line 111 and a liquid return line 112 coupled to the secondary side of the heat exchanger 105 of cooling system 102 to form the secondary loop. In addition, liquid supply line 111 is coupled to an intake port of immersion tank 103 and liquid return line 112 is coupled to an outlet port of immersion tank 103. Liquid supply line 111 is configured to receive the cooling liquid from heat exchanger 105 and to distribute the cooling liquid to immersion tank 103. Liquid return line 112 is configured to receive the cooling liquid carrying the heat exchanged from server blades 104 from immersion tank 103 and to return the cooling liquid back to heat exchanger 105 for heat exchange.

In addition, a liquid pump 115 may be disposed on liquid return line 112 to pump and circulate the cooling liquid to flow within the secondary loop. In addition, multiple pumps may be designed in the system (on main supply line 111 or on main return line 112 for redundant purpose. Note that if there are multiple immersion tanks within data center 101, there will be multiple pairs of liquid supply line and liquid return line to couple the immersion tanks with heat exchanger 105 of cooling system 102. Unlike conventional cooling systems, the secondary loop 107 via liquid supply line 111, immersion tank 103, and liquid return line 112 is a single heat transfer loop without using a CDU in between. Typically, a CDU also includes a heat exchanger having a primary loop and a secondary loop therein, which will form multiple loops between cooling system 102 and immersion tank 103. Also note that liquid pump 115 may be disposed on liquid supply line 111 or alternatively, there may be multiple liquid pumps, one disposed on liquid supply line 111 and another one disposed on liquid return line 112.

Figure 2:
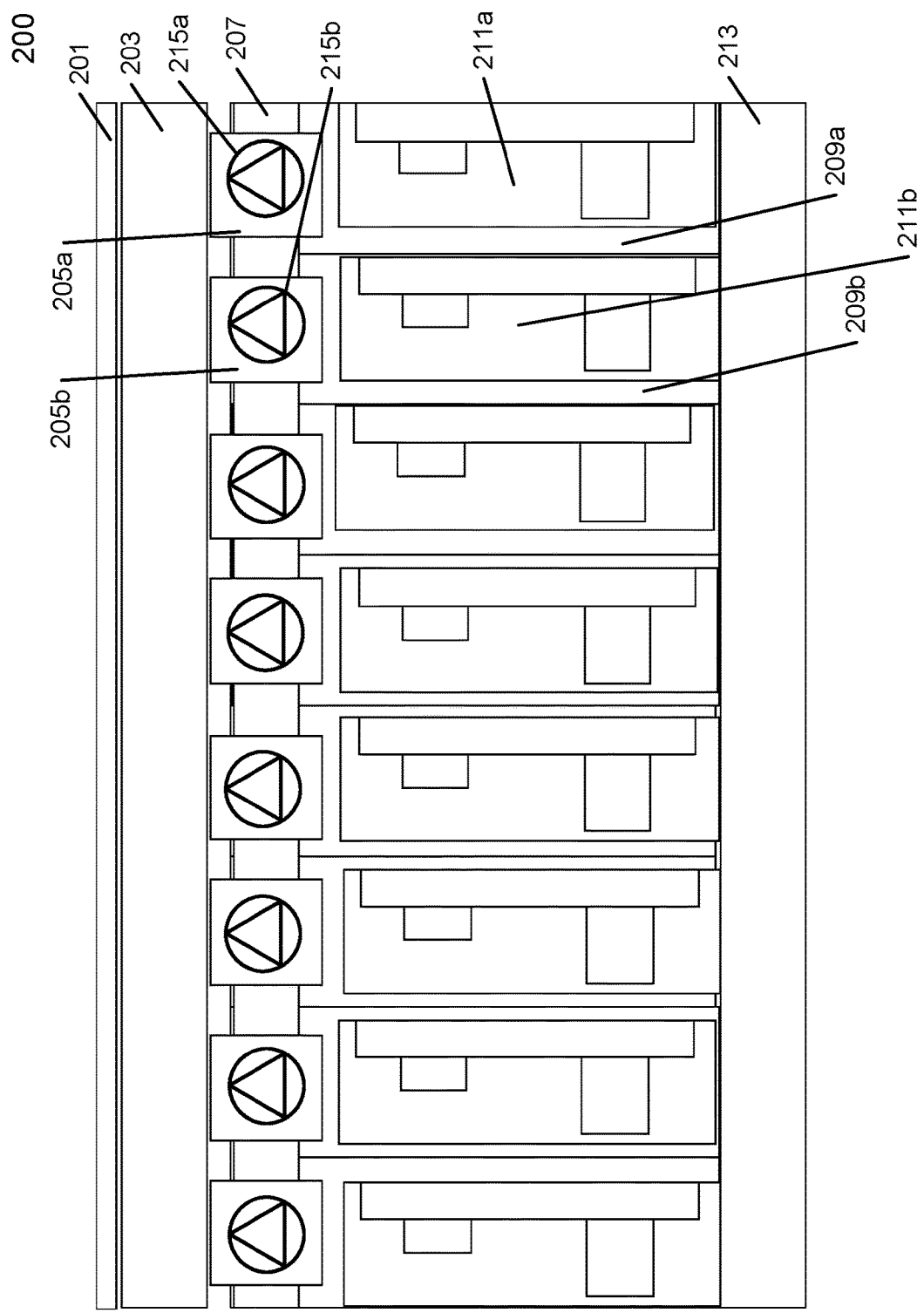
FIG. 2 is a block diagram illustrating an example of a portion of data center system with immersion cooling according to another embodiment.

FIG. 2 is a block diagram illustrating an example of a data center system 200 with immersion cooling according to another embodiment. For example, FIG. 2 shows the system design view from the front side. The immersion cooling system 200 may be utilized as a part of cooling system 100 of data center 101 as shown in FIG. 1. In an embodiment, the fluid supply channel 213 is designed on the bottom of the container 209. In an embodiment, the fluid supply channel 213 is the only source for supply fluid to the system in this architecture. In an embodiment, the main section includes multiple IT chambers (e.g., 209a, 209b). For example, the IT chambers (e.g., 209a 209b) are filled with immersion cooling fluid and it is used for populating IT equipment (e.g., 211a, 211b). In FIG. 1, for example, IT equipment (e.g., 211a, 211b) are shown populated and aligned in the IT chambers (e.g., 209a, 209b). In an embodiment, the fluid return channel 207 is used for the main system fluid return. In an embodiment, on the top of the IT equipment (e.g., 211a, 211b) there is a section (e.g., 205a, 205b) where a pump (e.g., 215a, 215b) is packaged. In an embodiment, the pump (e.g., 215a, 215b) is the localized pump which is used for accelerating the corresponding IT equipment (e.g., 211a, 211b) it is designed and assembled for. In an embodiment, the localized pumps (e.g., 215a, 215b) are connected to the fluid acceleration channel 203. For example, the fluid acceleration channel 203 can be understood as a channel or a loop. In an embodiment, the cooling system 200 includes a lid on the top of the fluid acceleration channel 203. For example, the lid is the very top cover of the system 200.

Figure 3:
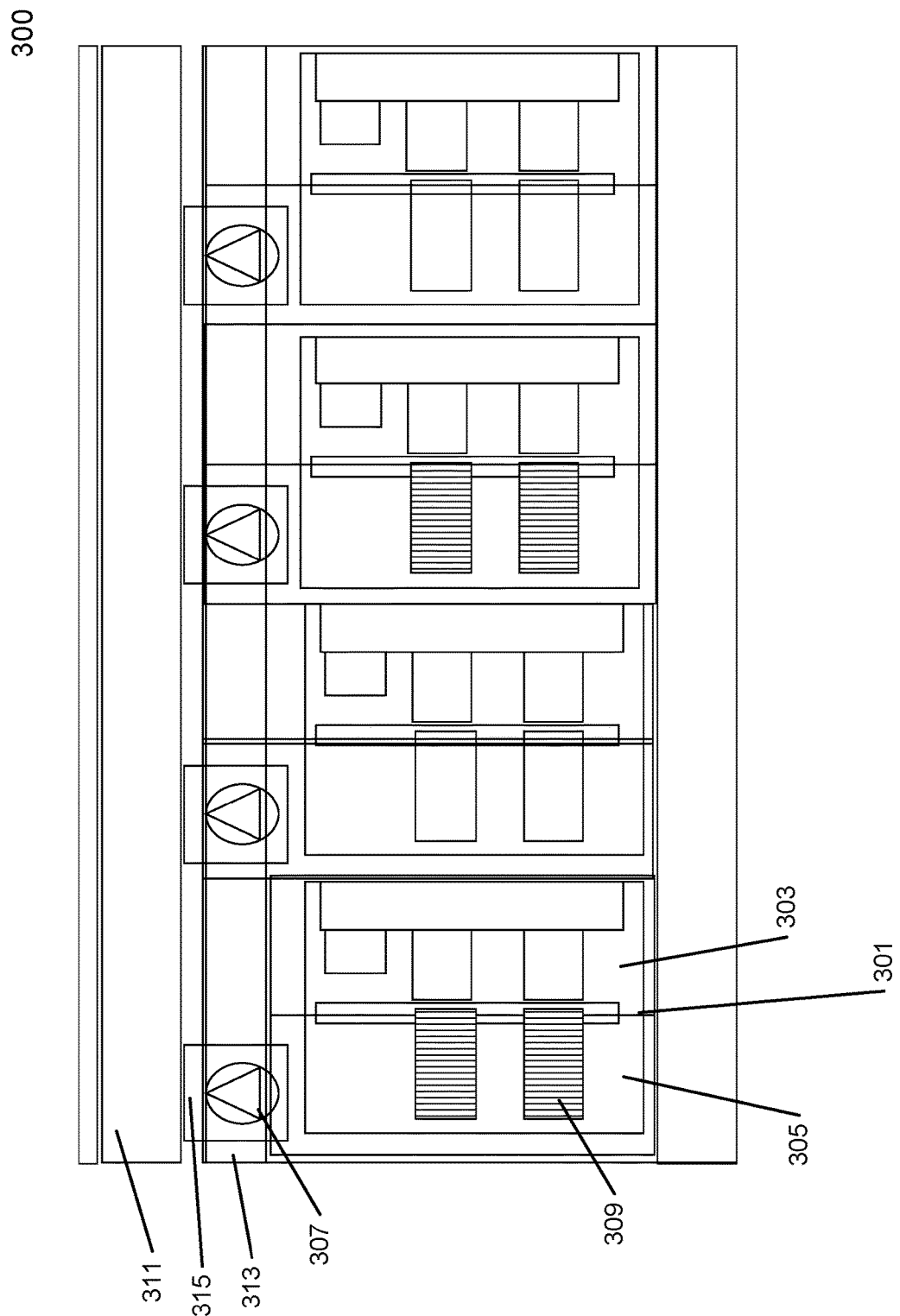
FIG. 3 is a block diagram illustrating an example of a portion of data center system with immersion cooling according to another embodiment.

FIG. 3 is a block diagram illustrating an example of a data center system 300 with immersion cooling according to an embodiment. FIG. 3 shows another system configuration according to an embodiment. In an embodiment, this design is a highly combined design with IT equipment 301. For example, it can be seen that the basic sections are the same as shown in FIG. 2. However, the IT equipment 301 are designed in two layers/sections 303, 305, even though these two sections 303, 305 are both integrated together as one complete system according to an embodiment. In an embodiment, the acceleration section 305 can be understood as an extension of the cooling area of portion 302. In an embodiment, in the acceleration section 305, the major cooling device 309 such as heat sinks are elevated to this section 305. In an embodiment, the other section 303 is the regular section which packaged the electronics. In an embodiment, since the system are designed in two sections 303, 305, it is more convenient to design and implement acceleration section 305 for the IT equipment 301. In an embodiment, only the acceleration section 305 is designed with acceleration pump 307 accordingly. For example, the acceleration sections 305 can be custom designed based on the IT populated in the immersion system, and it also provides possibilities for system design and operating efficiency.

In an embodiment, the acceleration pump 307 is dedicated for the major cooling device 309 in the acceleration section 305. In some embodiment, the location of the acceleration pump 307 is adjustable connected with the acceleration channel 311. In some embodiment, the acceleration pump 307 is coupled to and removable from the regular return channel 313.

In an embodiment, the acceleration pump 307 can be integrated to acceleration channel 311. In an embodiment, the acceleration channel 311 is not in the main immersion environment, and once the acceleration pump 307 is installed, it connects the immersion fluid with the acceleration channel 311.

In an embodiment, the acceleration channel 311 includes a fluid blind mating port such as male portion. In an embodiment, the acceleration pump side may include female portion to connect with male portion of the acceleration pump side for connections. In an embodiment, connections are blind mating quick disconnections.

In an embodiment, it can be understood as that the acceleration pump 307 is configured as a connecting component between the main immersion environment and the acceleration channel 311.

In an embodiment, the acceleration pump 307 is packaged within an additional channel 315, then the additional channel 315 is connected to the acceleration channel 311. In an embodiment, the acceleration pump 307 within the additional channel 315 pumping the fluid to accelerate the corresponding region 309. In an embodiment, the additional channel 315 has the acceleration pump 307 packaged inside. In an embodiment, one or more additional channels is connected to the acceleration channel to form a complete acceleration loop between the immersion tank to the converging channel.

In an embodiment, the acceleration channel can be individually dedicated connected to the converging channel. In an embodiment, the acceleration channel 311 can be merged together and parallel (in terms of fluid flowing) with the regular channel and then converges to converging channel. For example, the fluid is supplied from the main supply to the immersion system, and the fluid will flow through the electronics and then return to the converging channel before finally reaching the cooling unit. In an embodiment, if there are one or more acceleration channels, a portion of the fluid will be accelerated with a higher flow rate and pass through its corresponding acceleration channel and then to converge in the converging channel. This is an illustration of the parallel concept.

Figure 4:
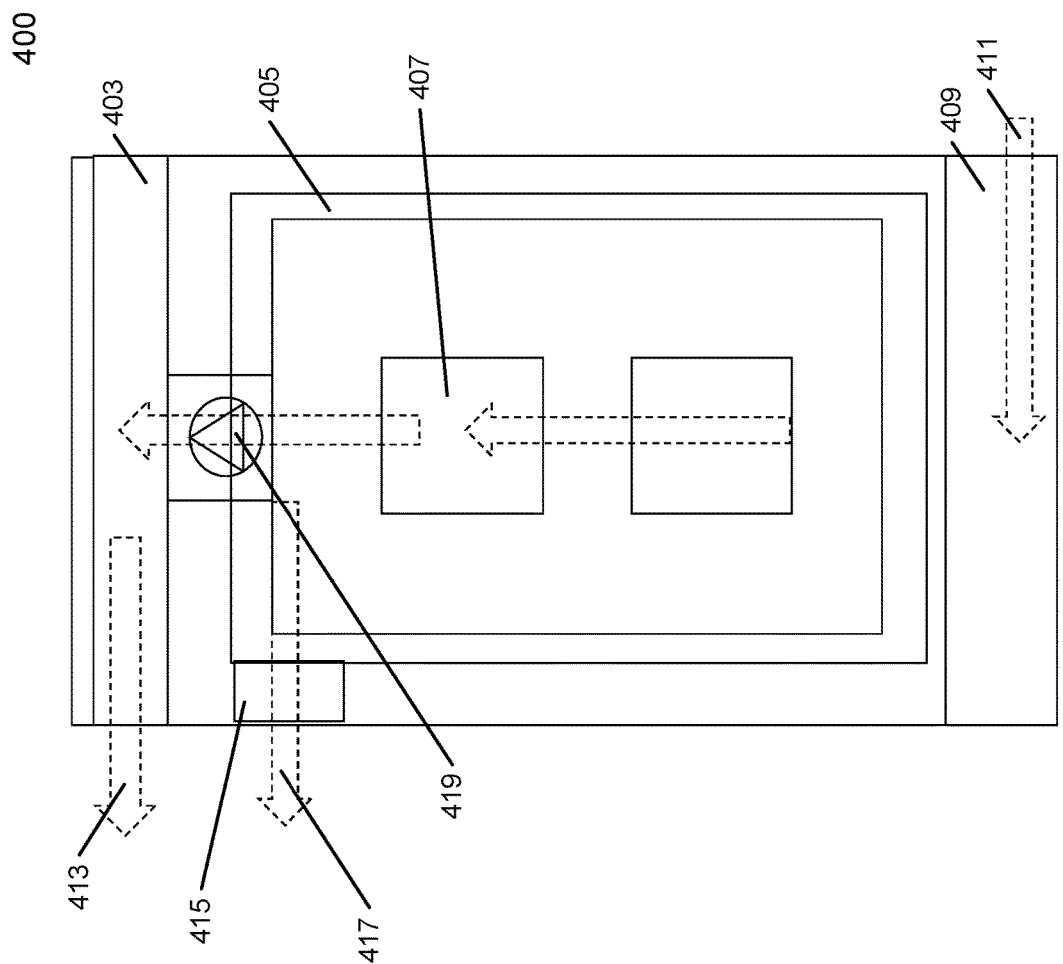
FIG. 4 is a block diagram illustrating an example of a portion of data center system with immersion cooling according to another embodiment.

FIG. 4 is a block diagram illustrating an example of a data center system 400 with immersion cooling according to another embodiment. FIG. 4 presents a side of design according to an embodiment. It can be seen the main supply 411 and main return 417 of the system are designed at the bottom and left side on the top. For example, it needs to be mentioned that these designs can be in different locations in the system, and the main functions are supply and return. In an embodiment, the localized pump 419 and the corresponding channel 413 are located on the top of the server and connected to the fluid acceleration channel 413. For example, it needs to be noted that this may require some server chassis optimization to have a better structural level adaption with the localized pump section.

Figure 5:
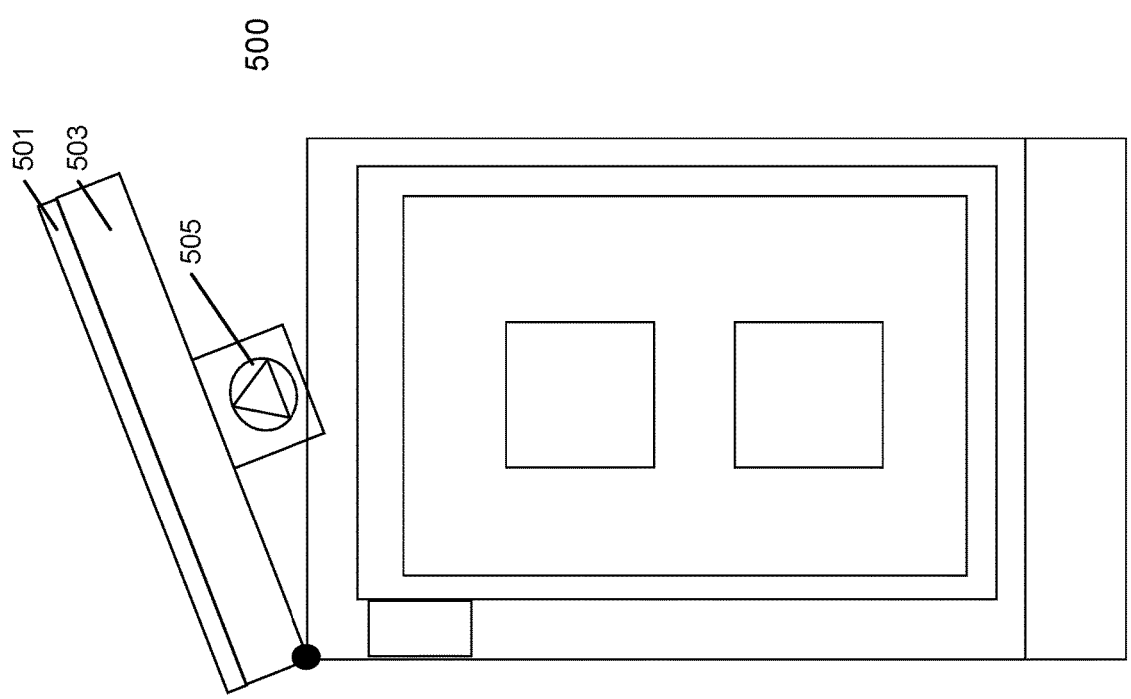
FIG. 5 is a block diagram illustrating an example of a portion of data center system with immersion cooling according to another embodiment.

In an embodiment, the arrow 411, 413, 417 shows the fluid flowing direction. For example, the current one shows that fluid goes into the immersion container 411 through the supply channel 409 and pass the PCB 405 including all the chips 407 before leaving the container. In an embodiment, the fluid 417 normally leaves the container through the fluid return channel 415. Also, the fluid 413 can be localized accelerated by the pump 419 and leaves the container faster through the fluid acceleration channel 403 according to an embodiment. In an embodiment, the lo FIG. 5 is a block diagram illustrating an example of a data center system 500 with immersion cooling according to another embodiment. For example, FIG. 5 shows that one of the design that integrate the acceleration channel 503 and acceleration pump/pumps 505 are integrated on the top lid 501 of the immersion container/tank. In an embodiment, different lid 501 can be switched with different acceleration configurations. For example, this can be understood as the top section 501, 503, 505 of the system. In an embodiment, the location of the acceleration pump 505 can be changed to be coupled to channel 503 under lid 501. In some embodiment, the acceleration pump 505, the acceleration channel 503, the top lid 501 and/or the entire top section can be dynamically reconfigured.

Figure 6:
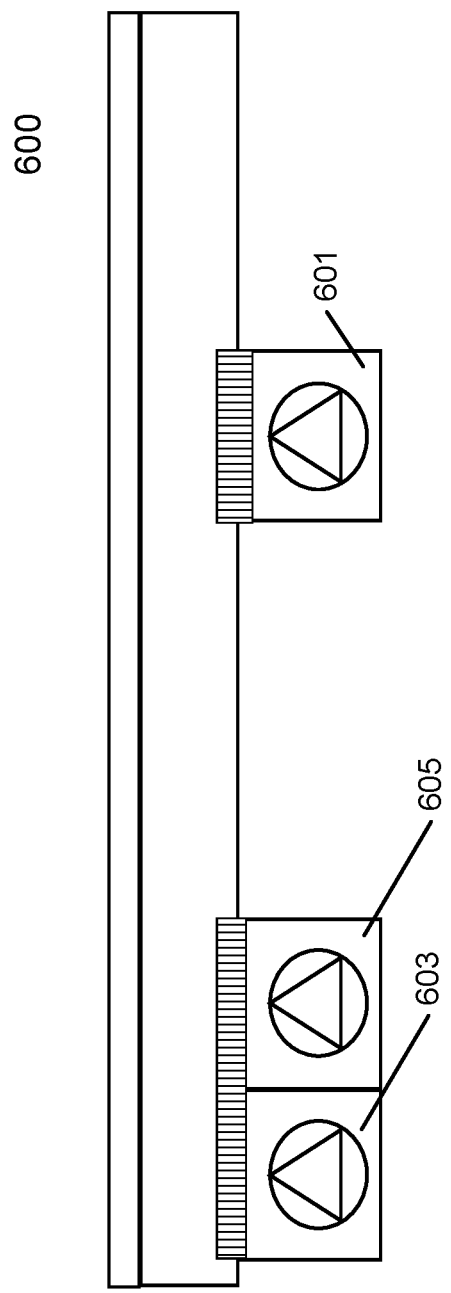
FIG. 6 is a block diagram illustrating an example of a top section of a data center system with immersion cooling according to another embodiment.

FIG. 6 is a block diagram illustrating an example of a top section 600 of a data center system with immersion cooling according to another embodiment. For example, FIG. 6 shows that the top section 600 can be flexible configured based on the IT characteristics populated in the system. For example, the container maybe populated with some GPU based high performance systems and storage system. In an embodiment, only the dedicated spaces where the GPU systems are populated are assembled with localized pumps 601, 603, 605. For example, the location of each acceleration pump (e.g., 601, 603, 605) can be adjusted based on the corresponding acceleration section. In an embodiment, acceleration pumps 601, 603, 605 are coupled to acceleration channel under lid. In some embodiment, the acceleration pumps 601, 603, 605, the acceleration channel, the top lid and/or the entire top section can be dynamically reconfigured. In an embodiment, one or more acceleration pumps (e.g., 601,603, 605) may be in idle based on the need of cooling enhancement. In an embodiment, all acceleration pumps may be in idle when no cooling enhancement is needed.

Figure 7:
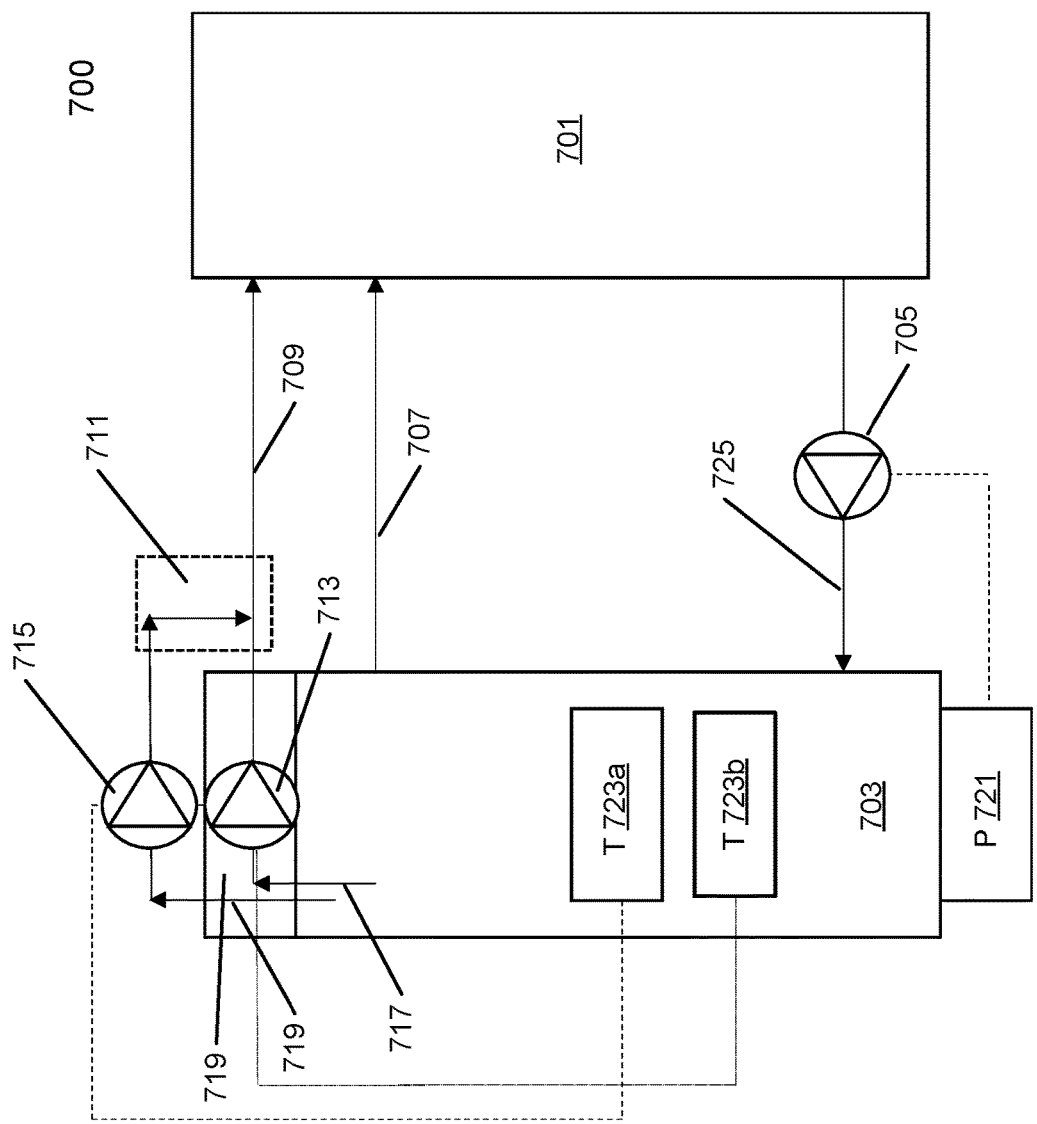
FIG. 7 is a block diagram illustrating an example of a data center system with immersion cooling according to another embodiment.

FIG. 7 is a block diagram illustrating an example of a data center system 700 with immersion cooling according to another embodiment. For example, FIG. 7 presents a schematic representation of the system and the control design. In an embodiment, the immersion tank 703 is connected to the cooling unit 701. In an embodiment, the cooling unit 701 can be understood as any fluid sources or cooling unit, either in a primary loop 725, 707 or secondary loop 725, 709. In an embodiment, the system pump 705 is used on the main supply loop 705 and the pump speed is controlled by the immersion system power (e.g., 721), either the rated power or actual operating power. In an embodiment, the pump speed can be set as a constant speed based on the system characterization. In an embodiment, one or more acceleration pumps 713, 715 are forming separate loops 717, 719 form the immersion tank 703 and the coolant unit 701. In an embodiment, it can be seen that the pumps 713, 715 pump fluid form the immersion tank 703 precisely from certain area or locations, and the fluid 717, 719 pumped by these acceleration pumps 713, 715 forming together in the fluid acceleration channel 711, 719. In an embodiment, the localized acceleration pump 713, 715 are controlled through the measurements of the localized temperature (e.g., T 723) such as GPU temperatures or other high power density electronics' temperatures. It needs to be motioned that each individual acceleration pump (e.g., 713, 715) may be connected to different sensors 723a, 723b, or input control signals 721.

Figure 8:
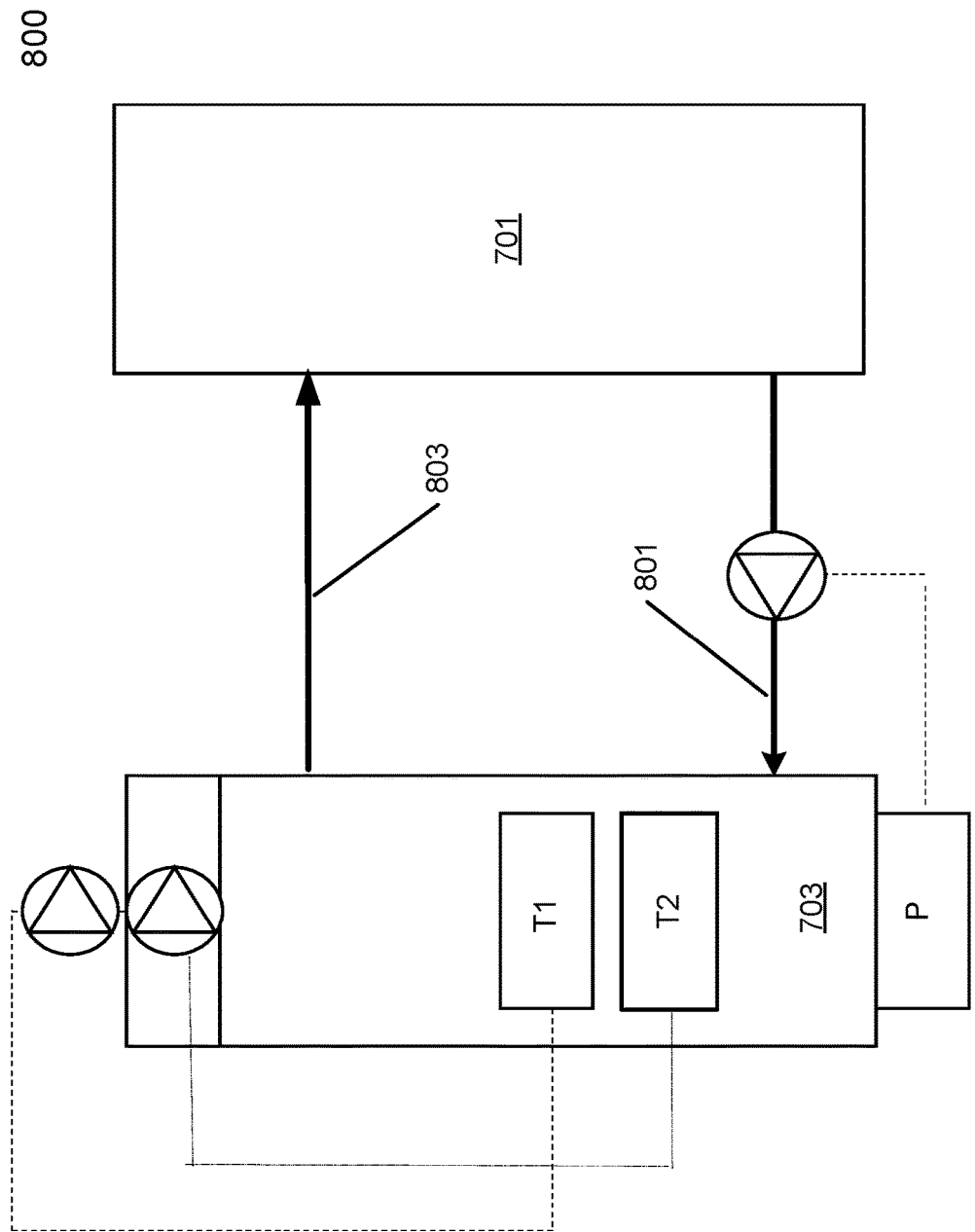
FIG. 8 is a block diagram illustrating an example of a data center system with immersion cooling under a normal operation mode according to another embodiment.

FIG. 8 is a block diagram illustrating an example of a data center system 800 with immersion cooling under a normal operation mode according to an embodiment. For example, FIG. 8 shows the fluid 801, 803 flowing manner during the normal operating mode. In an embodiment, under the normal operating mode, the supply fluid 801 flows from the cooling unit 701 to the immersion tank 703 and the return fluid 803 flows from the immersion tank 703 to the cooling unit 701.

Figure 9:
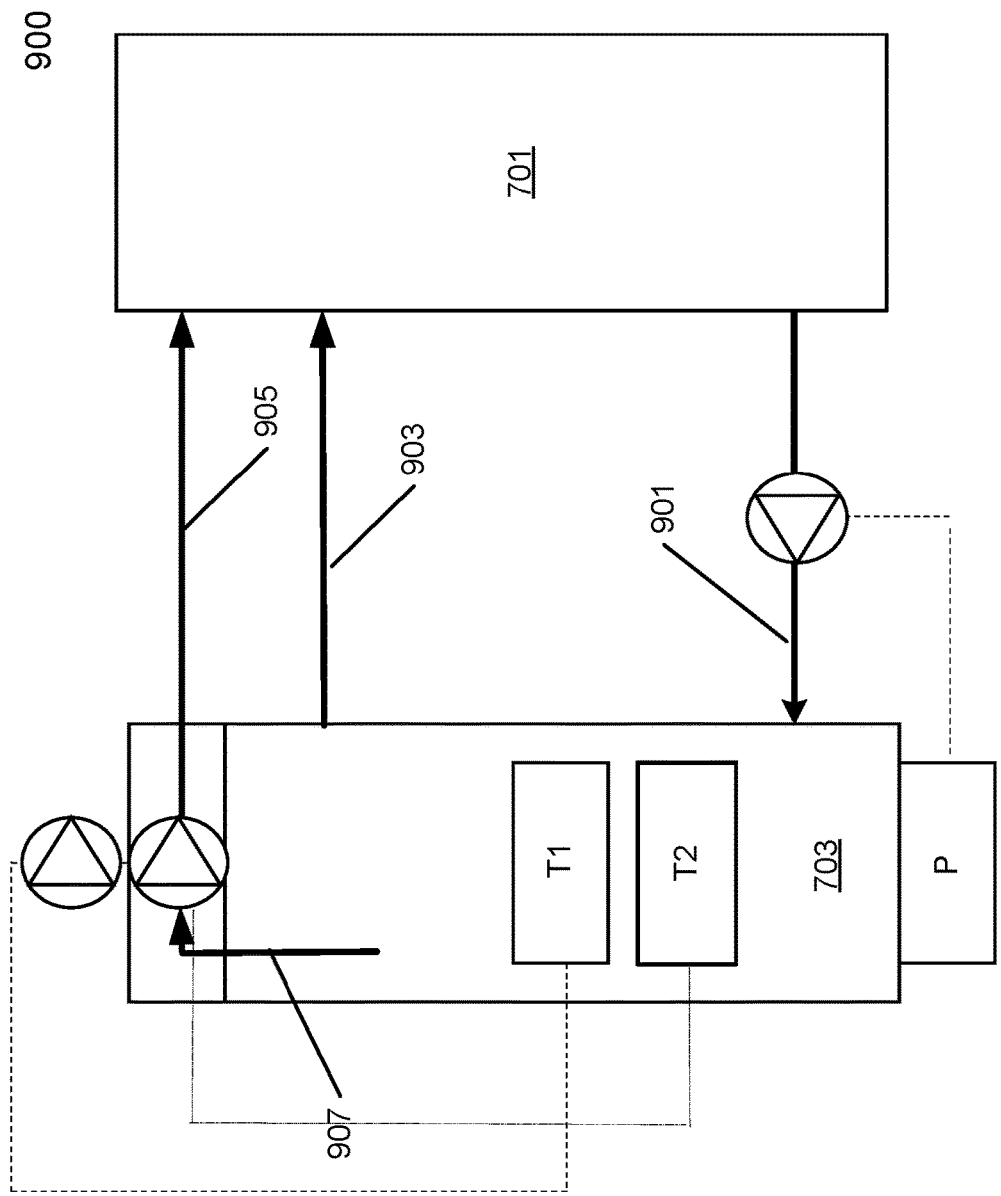
FIG. 9 is a block diagram illustrating an example of a data center system with immersion cooling under a single acceleration mode according to another embodiment.

FIG. 9 is a block diagram illustrating an example of a data center system 900 with immersion cooling under a single acceleration mode according to another embodiment. For example, FIG. 9 shows the fluid flowing diagram when one of the acceleration 907 functions. In an embodiment, under the single acceleration mode, the supply fluid 901 flows from the cooling unit 701 to the immersion tank 703, the return fluid 903 flows from the immersion tank 703 to the cooling unit 701, and the first acceleration fluid 907, 905 also flows from the immersion tank 703 to the cooling unit 701.

Figure 10:
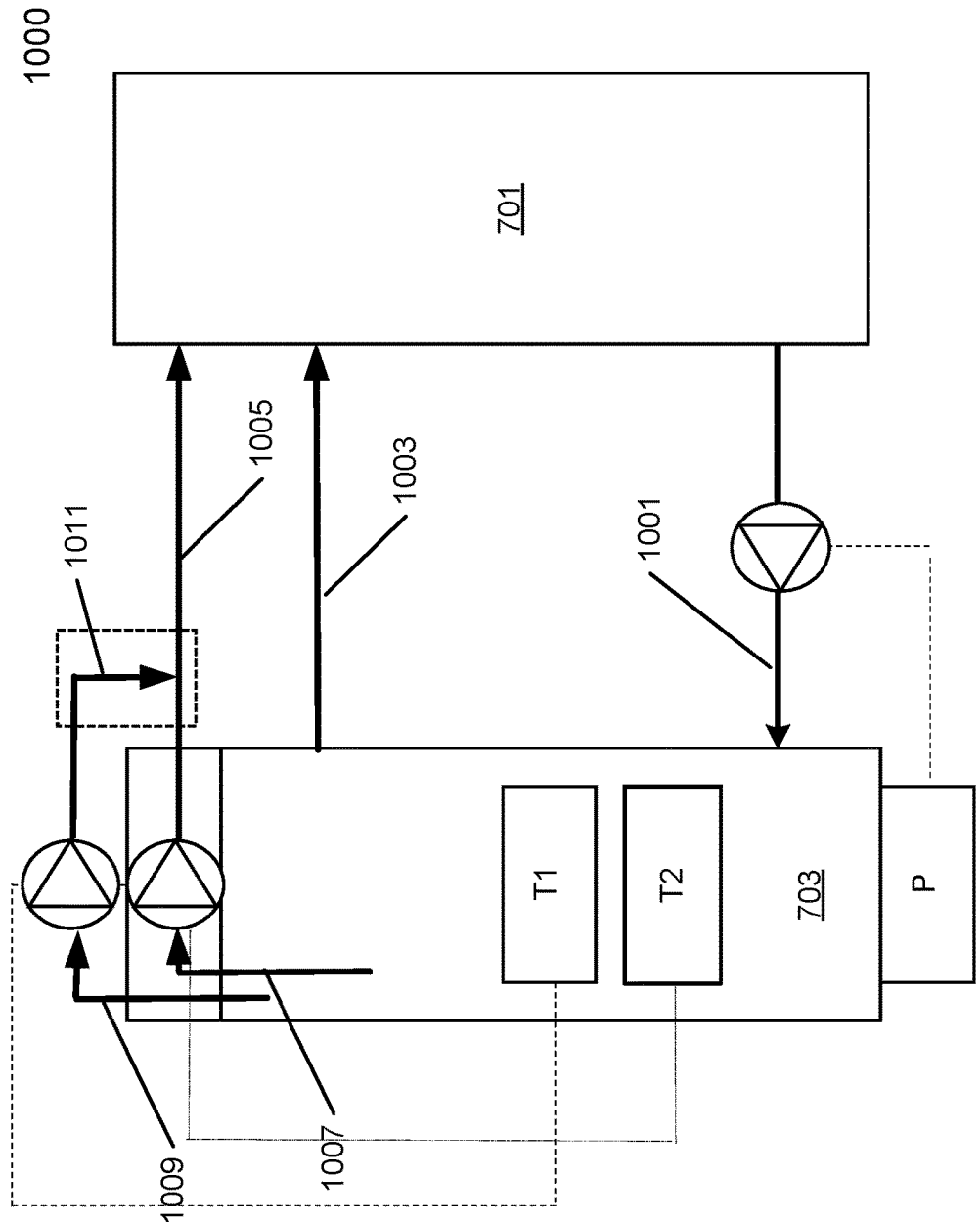
FIG. 10 is a block diagram illustrating an example of a data center system with immersion cooling under a multiple acceleration mode according to another embodiment

FIG. 10 is a block diagram illustrating an example of a data center system 1000 with immersion cooling under a multiple acceleration mode according to another embodiment. For example, FIG. 10 shows system fluid flowing diagram when multiple localized fluid acceleration 1007, 1009 are in active mode. In an embodiment, under the multiple acceleration mode, the supply fluid 1001 flows from the cooling unit 701 to the immersion tank 703. In some embodiment, the return fluid 1003 flows from the immersion tank 703 to the cooling unit 701. In an embodiment, he first acceleration fluid 1007 and the second acceleration fluid 1009 flows from the immersion tank 703 to the cooling unit 701 through acceleration channel 1011, 1005.

In the foregoing specification, embodiments of the invention have been described with reference to specific exemplary embodiments thereof. It will be evident that various modifications may be made thereto without departing from the broader spirit and scope of the invention as set forth in the following claims. The specification and drawings are, accordingly, to be regarded in an illustrative sense rather than a restrictive sense.

What is claimed is:

1. A cooling system, comprising:
   an information technology (IT) container including a plurality of IT chambers, each IT chamber to store fluid and to receive IT equipment submerged in the fluid for immersion cooling;
   a fluid supply channel disposed at a bottom of the IT container to receive the fluid from a cooling unit and to supply the fluid to the IT chambers;
   a fluid return channel disposed on a top of the IT chambers to return the fluid received from the IT chambers to the cooling unit;
   a fluid acceleration channel disposed separately from the fluid return channel to return at least some of the fluid to the cooling unit in an accelerated manner; and
   one or more pumps disposed between at least some of the IT chambers and the fluid acceleration channel to increase a flowrate of the fluid from the corresponding IT chambers to the cooling unit via the fluid acceleration channel.

2. The cooling system of claim 1, wherein each of the one or more pumps are configured to pump the fluid from the fluid supply channel through the corresponding IT chamber to the fluid acceleration channel.

3. The cooling system of claim 1, wherein at least one IT equipment includes a regular section containing an IT component that generates heat and an acceleration section containing a local heat exchange element attached to the IT component, both the regular section and the acceleration section integrated as one complete system.

4. The cooling system of claim 3, wherein a pump associated with the IT equipment is disposed in the acceleration section to increase the flowrate of the fluid in the acceleration section.

5. The cooling system of claim 3, wherein the local heat exchange element includes a heat sink elevated to the acceleration section.

6. The cooling system of claim 1, wherein the fluid acceleration channel is disposed on top of the fluid return channel.

7. The cooling system of claim 1, wherein the flowrate of the fluid in an IT chamber is controlled by a corresponding pump based on a local temperature of the fluid within the corresponding IT chamber.

8. The cooling system of claim 1, wherein each pump is integrated to the fluid acceleration channel and coupled to and removable from the fluid return channel of the IT container.

9. The cooling system of claim 8, further comprising a lid, wherein the fluid acceleration channel and the pumps are integrated to a lid section including the lid, such that when the lid section is lifted, the fluid acceleration channel and the pumps are lifted and removed from the IT chambers.

10. The cooling system of claim 8, wherein the pumps are integrated to the fluid acceleration channel attached to the lid, and wherein the location of each pump is adjustable based on the corresponding IT equipment.

11. An electronic rack of a data center, comprising:
   one or more information technology (IT) equipment operating as one or more servers; and
   a cooling system coupled to the IT equipment, the cooling system including
      an IT container including a plurality of IT chambers, each IT chamber to store fluid and to receive IT equipment submerged in the fluid for immersion cooling;
      a fluid supply channel disposed at a bottom of the IT container to receive the fluid from a cooling unit and to supply the fluid to the IT chambers;
      a fluid return channel disposed on a top of the IT chambers to return the fluid received from the IT chambers to the cooling unit;
      a fluid acceleration channel disposed separately from the fluid return channel to return at least some of the fluid to the cooling unit in an accelerated manner; and
      one or more pumps disposed between at least some of the IT chambers and the fluid acceleration channel to increase a flowrate of the fluid from the corresponding IT chambers to the cooling unit via the fluid acceleration channel.

12. The electronic rack of claim 11, wherein each of the one or more pumps are configured to pump the fluid from the fluid supply channel through the corresponding IT chamber to the fluid acceleration channel.

13. The electronic rack of claim 11, wherein at least one IT equipment includes a regular section containing an IT component that generates heat and an acceleration section containing a local heat exchange element attached to the IT component, both the regular section and the acceleration section integrated as one complete system.

14. The electronic rack of claim 13, wherein a pump associated with the IT equipment is disposed in the acceleration section to increase the flowrate of the fluid in the acceleration section.

15. The electronic rack of claim 13, wherein the local heat exchange element includes a heat sink elevated to the acceleration section.

16. The electronic rack of claim 13, wherein the fluid acceleration channel is disposed on top of the fluid return channel.

17. The electronic rack of claim 11, wherein the flowrate of the fluid in an IT chamber is controlled by a corresponding pump based on a local temperature of the fluid within the corresponding IT chamber.

18. The electronic rack of claim 11, wherein each pump is integrated to the fluid acceleration channel and coupled to and removable from the fluid return channel of the IT container.

19. The electronic rack of claim 18, further comprising a lid, wherein the fluid acceleration channel and the pumps are integrated to a lid section including the lid, such that when the lid section is lifted, the fluid acceleration channel and the pumps are lifted and removed from the IT chambers.

20. A data center system, comprising:
   a plurality of electronic racks, each electronic rack including
      one or more information technology (IT) equipment operating as one or more servers; and
      a cooling system coupled to the IT equipment to provide liquid cooling to the servers, the cooling system including
         an information technology (IT) container including a plurality of IT chambers, each IT chamber to store fluid and to receive IT equipment submerged in the fluid for immersion cooling;
         a fluid supply channel disposed at a bottom of the IT container to receive the fluid from a cooling unit and to supply the fluid to the IT chambers;

a fluid return channel disposed on a top of the IT chambers to return the fluid received from the IT chambers to the cooling unit;

a fluid acceleration channel disposed separately from the fluid return channel to return at least some of the fluid to the cooling unit in an accelerated manner; and one or more pumps disposed between at least some of the IT chambers and the fluid acceleration channel to increase a flowrate of the fluid from the corresponding IT chambers to the cooling unit via the fluid acceleration channel.

\* \* \* \* \*